United States Patent
Chen et al.

(10) Patent No.: US 10,879,672 B2
(45) Date of Patent: Dec. 29, 2020

(54) INCREASED MODULATION BANDWIDTH AND PHASE CONTROL IN VCSELS WITH RECESSED STRUCTURES IN A REFLECTOR LAYER

(71) Applicant: HUAWEI TECHNOLOGIES CO., LTD., Shenzhen (CN)

(72) Inventors: Jian Chen, Wuhan (CN); Jing Hu, Shenzhen (CN); Zhiguang Xu, Shenzhen (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 96 days.

(21) Appl. No.: 15/922,931

(22) Filed: Mar. 16, 2018

(65) Prior Publication Data

US 2018/0212403 A1 Jul. 26, 2018

Related U.S. Application Data

(63) Continuation of application No. PCT/CN2015/089774, filed on Sep. 16, 2015.

(51) Int. Cl.
*H01S 5/183* (2006.01)
*H01S 5/065* (2006.01)

(52) U.S. Cl.
CPC ........ *H01S 5/18386* (2013.01); *H01S 5/0654* (2013.01); *H01S 5/18313* (2013.01); *H01S 5/18361* (2013.01); *H01S 5/18355* (2013.01)

(58) Field of Classification Search
CPC ............. H01S 5/18361; H01S 5/18386; H01S 5/18313; H01S 5/0654; H01S 5/18355
See application file for complete search history.

(56) References Cited

U.S. PATENT DOCUMENTS

| | | |
|---|---|---|
| 2003/0007528 A1 | 1/2003 | Uchiyama et al. |
| 2007/0248125 A1 | 10/2007 | Shiozaki |
| 2010/0029027 A1* | 2/2010 | Ikuta .................. H01S 5/18391 438/29 |
| 2010/0029030 A1 | 2/2010 | Uchida et al. |
| 2010/0208760 A1 | 8/2010 | Yoshikawa |
| 2011/0076058 A1 | 3/2011 | Ikuta et al. |
| 2011/0090929 A1 | 4/2011 | Ikuta |
| 2015/0036711 A1 | 2/2015 | Ikuta |

FOREIGN PATENT DOCUMENTS

| | | |
|---|---|---|
| CN | 1444787 A | 9/2003 |
| CN | 101640375 A | 2/2010 |
| CN | 101640376 A | 2/2010 |
| CN | 101685941 A | 3/2010 |
| CN | 103168402 A | 6/2013 |
| JP | H11274640 A | 10/1999 |

(Continued)

OTHER PUBLICATIONS

Geert Morthier et al., Extended Modulation Bandwidth of DBR and External Cavity Lasers by Utilizing a Cavity Resonance for Equalization. IEEE Journal of Quantum Electronics, vol. 36, No. 12, Dec. 2000, 8 pages.

*Primary Examiner* — M. A. Golub-Miller
(74) *Attorney, Agent, or Firm* — Kilpatrick Townsend & Stockton LLP

(57) ABSTRACT

A semiconductor laser (100) and a method for processing the semiconductor laser are provided, so that modulation bandwidth can be increased.

7 Claims, 3 Drawing Sheets

(56) References Cited

FOREIGN PATENT DOCUMENTS

| | | | |
|---|---|---|---|
| JP | 2001234722 | A | 10/2001 |
| JP | 2003069151 | A | 3/2003 |
| JP | 2003535480 | A | 11/2003 |
| JP | 2005277309 | A | 10/2005 |
| JP | 2005353623 | A | 12/2005 |
| JP | 2006120881 | A | 5/2006 |
| JP | 2010186899 | A | 8/2010 |
| KR | 20120117032 | A | 10/2012 |

* cited by examiner

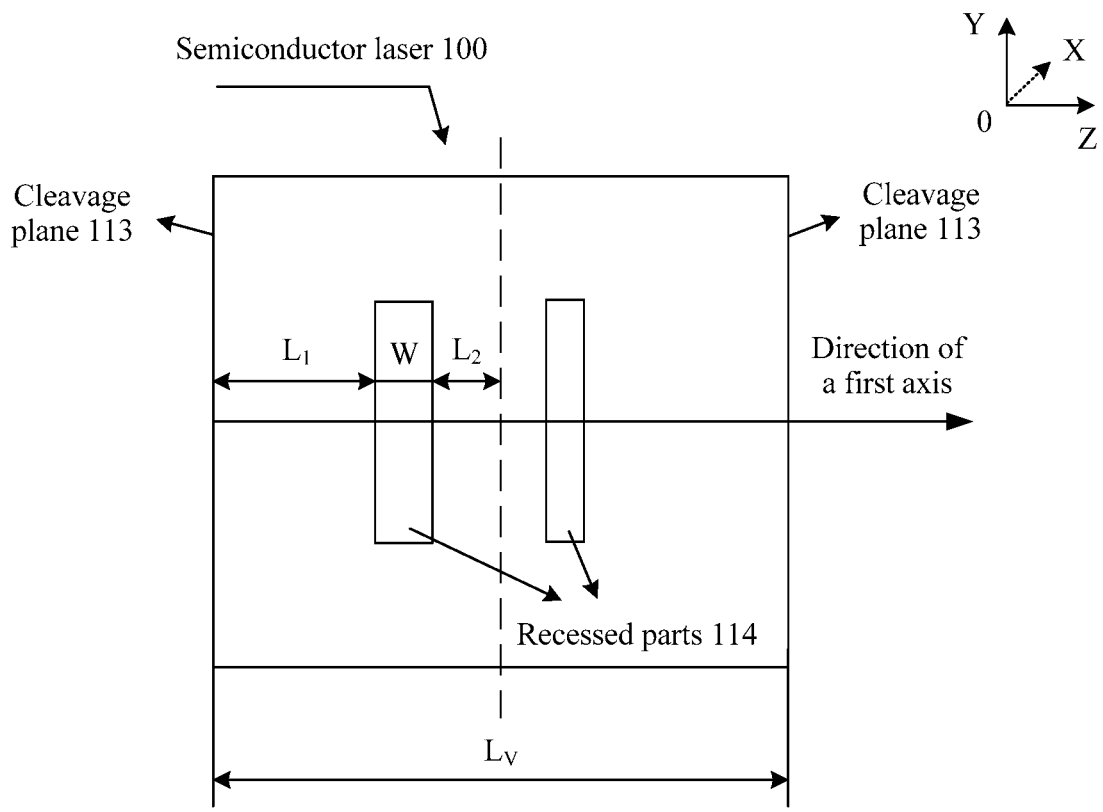

Form a resonant cavity, where the resonant cavity includes an upper reflector layer and a lower reflector layer that are made of a semiconductor material, and the upper reflector layer is located above the lower reflector layer in a vertical direction — S210

Form an active layer, where the active layer is located between the upper reflector layer and the lower reflector layer — S220

Process at least two recessed parts in at least one of the upper reflector layer or the lower reflector layer — S230

FIG. 3

INCREASED MODULATION BANDWIDTH AND PHASE CONTROL IN VCSELS WITH RECESSED STRUCTURES IN A REFLECTOR LAYER

CROSS-REFERENCE TO RELATED APPLICATIONS

This application is a continuation of International Application No. PCT/CN2015/089774, filed on Sep. 16, 2015, the disclosure of which is hereby incorporated by reference in its entirety.

TECHNICAL FIELD

The present disclosure relates to the optical communications field, and more specifically, to a semiconductor laser and a method for processing the semiconductor laser.

BACKGROUND

A semiconductor laser is a key component for light source emission in a fiber optic communications system. As communications technologies develop, and an amount of information increases, a fiber optic communications system for implementing long-distance high-speed transmission needs to be provided. Currently, a long-wavelength semiconductor laser such as a vertical-cavity surface-emitting laser (Vertical-Cavity Surface-Emitting Laser, "VCSEL" for short) becomes an ideal light source emission component for long-distance transmission in fiber optic communication.

With popularization of the communications technologies, a requirement for modulation bandwidth is increasingly high. How to increase modulation bandwidth of a semiconductor laser becomes an urgent problem to be resolved.

SUMMARY

Embodiments of the present disclosure provide a semiconductor laser and a method for processing the semiconductor laser, so that modulation bandwidth of the semiconductor laser can be increased.

According to a first aspect, a semiconductor laser is provided, including: a resonant cavity, configured to enable a photon entering the resonant cavity to obtain a gain, where the resonant cavity includes an upper reflector layer and a lower reflector layer that are made of a semiconductor material, the upper reflector layer is located above the lower reflector layer, a projection of the upper reflector layer on a horizontal plane all falls within a range of a projection of the lower reflector layer on the horizontal plane, a part or all of a side face of the upper reflector layer and a part or all of a side face of the lower reflector layer form a cleavage plane of the semiconductor laser, and the cleavage plane is perpendicular to the horizontal plane; and an active layer, configured to emit a beam, where the active layer is made of a semiconductor material, the active layer is located between the upper reflector layer and the lower reflector layer, a projection of the active layer on the horizontal plane all falls within the range of the projection of the lower reflector layer on the horizontal plane, an oxidation hole is disposed above the active layer, and the oxidation hole is configured to limit a transverse mode of the beam, where at least two recessed parts are disposed in at least one of the upper reflector layer or the lower reflector layer; projections of the at least two recessed parts on the horizontal plane are located on a first axis; the first axis is perpendicular to a tangent direction of the cleavage plane and the first axis passes through a projection of a center of the active layer on the horizontal plane, or the first axis is perpendicular to the cleavage plane; a distance $L_V$ between two points at which the cleavage plane is intersected with the first axis is determined according to a wavelength $\lambda$ of the beam and a free spectral range FSR; and a shortest distance $L_1$ between each of the at least two recessed parts and the cleavage plane is determined according to the distance $L_V$ and a radius $R_o$ of the oxidation hole, so that a first beam that is emitted by the active layer in a direction parallel to the first axis and that is reflected after reaching the cleavage plane and a second beam emitted by the active layer in the direction parallel to the first axis generate photon resonance.

With reference to the first aspect, in a first implementation of the first aspect, the distance $L_V$ meets:

$$L_V = \frac{\lambda^2}{2n_g \cdot FSR},$$

where $n_g$ is a group refractive index of a medium in the cavity of the semiconductor laser.

With reference to the first aspect and the foregoing implementation of the first aspect, in a second implementation of the first aspect, the shortest distance $L_1$ meets:

$$\frac{L_V}{2} - R_o < L_1 < \frac{L_V}{2}.$$

With reference to the first aspect and the foregoing implementation of the first aspect, in a third implementation of the first aspect, a distance $L_2$ between a projection of each recessed part on the horizontal plane and the projection of the center of the active layer on the horizontal plane and a distance W between two points at which the same recessed part is intersected with the first axis meet:

$R_o > W + L_2 > R_s$, where $R_s$ is a radius of a single-transverse mode spot of the semiconductor laser.

With reference to the first aspect and the foregoing implementations of the first aspect, in a fourth implementation of the first aspect, the radius $R_o$ of the oxidation hole is greater than A, so that the semiconductor laser is in a multi-transverse mode state, where A is a preset constraint factor that determines whether the semiconductor laser is in a single-transverse mode state or the multi-transverse mode state; and a depth H of each recessed part is determined according to the wavelength $\lambda$, so that the semiconductor laser is switched from the multi-transverse mode state to the single-transverse mode state.

With reference to the first aspect and the foregoing implementation of the first aspect, in a fifth implementation of the first aspect, the depth H meets:

$$H = \frac{(2m+1)\lambda}{4n_{\mathit{eff}}},$$

where m≥0, m is an integer, and $n_{eff}$ is an effective refractive index that is of the semiconductor laser and that exists when the at least two recessed parts are not disposed.

With reference to the first aspect and the foregoing implementations of the first aspect, in a sixth implementation of the first aspect, the distance $L_2$ between the projection of each recessed part on the horizontal plane and the projection of the center of the active layer on the horizontal plane meets:

$$L_2 = \frac{V_{eff} \cdot \lambda}{2\pi \cdot \sqrt{n_{eff}^2 - (n_{eff} - \gamma \cdot \Delta n)^2}} \text{ and } B < V_{eff} < C,$$

where

B and C are preset constraint factors determining that the semiconductor laser is in a single-longitudinal mode state, $V_{eff}$ is a normalized frequency parameter, γ is an impact factor of the depth H of the recessed part, and $n_{eff}$ is the effective refractive index that is of the semiconductor laser and that exists when the at least two recessed parts are not disposed.

With reference to the first aspect and the foregoing implementations of the first aspect, in a seventh implementation of the first aspect, the upper reflector layer is a distributed Bragg reflector, the lower reflector layer is a distributed Bragg reflector, and the semiconductor laser is a vertical-cavity surface-emitting laser.

According to a second aspect, a method for processing a semiconductor laser is provided, where the processing method includes: forming a resonant cavity, where the resonant cavity is configured to enable a photon entering the resonant cavity to obtain a gain, the resonant cavity includes an upper reflector layer and a lower reflector layer that are made of a semiconductor material, the upper reflector layer is located above the lower reflector layer in a vertical direction, a projection of the upper reflector layer on a horizontal plane all falls within a range of a projection of the lower reflector layer on the horizontal plane, a part or all of a side face of the upper reflector layer and a part or all of a side face of the lower reflector layer form a cleavage plane of the semiconductor laser, and the cleavage plane is perpendicular to the horizontal plane; forming an active layer, where the active layer is configured to emit a beam, the active layer is made of a semiconductor material, the active layer is located between the upper reflector layer and the lower reflector layer, a projection of the active layer on the horizontal plane all falls within the range of the projection of the lower reflector layer on the horizontal plane, an oxidation hole is disposed above the active layer, and the oxidation hole is configured to limit a transverse mode of the beam; and processing at least two recessed parts in at least one of the upper reflector layer or the lower reflector layer, where projections of the at least two recessed parts on the horizontal plane are located on a first axis; the first axis is perpendicular to a tangent direction of the cleavage plane and the first axis passes through a projection of a center of the active layer on the horizontal plane, or the first axis is perpendicular to the cleavage plane; a distance $L_V$ between two points at which the cleavage plane is intersected with the first axis is determined according to a wavelength λ of the beam and a free spectral range FSR; and a shortest distance $L_1$ between each of the at least two recessed parts and the cleavage plane is determined according to the distance $L_V$ and a radius $R_o$ of the oxidation hole, so that a first beam that is emitted by the active layer in a direction parallel to the first axis and that is reflected after reaching the cleavage plane and a second beam emitted by the active layer in the direction parallel to the first axis generate photon resonance.

With reference to the second aspect, in a first implementation of the second aspect, the distance $L_V$ meets:

$$L_V = \frac{\lambda^2}{2n_g \cdot FSR},$$

where $n_g$ is a group refractive index of a medium in the cavity of the semiconductor laser.

With reference to the second aspect and the foregoing implementation of the second aspect, in a second implementation of the second aspect, the shortest distance $L_1$ meets:

$$\frac{L_V}{2} - R_o < L_1 < \frac{L_V}{2}.$$

With reference to the second aspect and the foregoing implementation of the second aspect, in a third implementation of the second aspect, a distance $L_2$ between a projection of each recessed part on the horizontal plane and the projection of the center of the active layer on the horizontal plane and a distance W between two points at which the same recessed part is intersected with the first axis meet:

$R_o > W + L_2 > R_s$, where $R_s$ is a radius of a single-transverse mode spot of the semiconductor laser.

With reference to the second aspect and the foregoing implementations of the second aspect, in a fourth implementation of the second aspect, the radius $R_o$ of the oxidation hole is greater than A, so that the semiconductor laser is in a multi-transverse mode state, where A is a preset constraint factor that determines whether the semiconductor laser is in a single-transverse mode state or the multi-transverse mode state; and the processing at least two recessed parts in at least one of the upper reflector layer or the lower reflector layer includes: determining a depth H of the recessed part according to the wavelength λ; and processing the at least two recessed parts in at least one of the upper reflector layer or the lower reflector layer according to the depth H, so that the semiconductor laser is switched from the multi-transverse mode state to the single-transverse mode state.

With reference to the second aspect and the foregoing implementation of the second aspect, in a fifth implementation of the second aspect, the determining a depth H of the recessed part according to the wavelength λ includes:

determining the depth H of the recessed part according to $$H = \frac{(2m+1)\lambda}{4n_{eff}},$$

where m≥0, m is an integer, and $n_{eff}$ is an effective refractive index that is of the semiconductor laser and that exists when the at least two recessed parts are not disposed.

With reference to the second aspect and the foregoing implementations of the second aspect, in a sixth implementation of the second aspect, the distance $L_2$ between the projection of each recessed part on the horizontal plane and the projection of the center of the active layer on the horizontal plane meets:

$$L_2 = \frac{V_{\mathit{eff}} \cdot \lambda}{2\pi \cdot \sqrt{n_{\mathit{eff}}^2 - (n_{\mathit{eff}} - \gamma \cdot \Delta n)^2}} \text{ and } B < V_{\mathit{eff}} < C,$$

where

B and C are preset constraint factors determining that the semiconductor laser is in a single-longitudinal mode state, and $n_{\mathit{eff}}$ is the effective refractive index that is of the semiconductor laser and that exists when the at least two recessed parts are not disposed.

With reference to the second aspect and the foregoing implementations of the second aspect, in a seventh implementation of the second aspect, the upper reflector layer is a distributed Bragg reflector, the lower reflector layer is a distributed Bragg reflector, and the semiconductor laser is a vertical-cavity surface-emitting laser.

According to the semiconductor laser and the method for processing the semiconductor laser in the embodiments of the present disclosure, at least two recessed parts are disposed in at least one of the upper reflector layer or the lower reflector layer, and a location and a size of each recessed part, and a partial structure and size of the semiconductor laser are limited, so that a traveling wave transmitted in the semiconductor laser in a transverse direction and a reflected wave generate photon resonance. Therefore, modulation bandwidth of a component is increased.

BRIEF DESCRIPTION OF DRAWINGS

To describe the technical solutions in the embodiments of the present disclosure more clearly, the following briefly describes the accompanying drawings required for describing the embodiments or the prior art. Apparently, the accompanying drawings in the following description show only some embodiments of the present disclosure, and a person of ordinary skill in the art may still derive other drawings from these accompanying drawings without creative efforts.

FIG. 2b is another schematic structural diagram of a semiconductor laser according to an embodiment of the present disclosure; and FIG. 3 is a schematic flowchart of a method for processing a semiconductor laser according to an embodiment of the present disclosure.

DESCRIPTION OF EMBODIMENTS

The following clearly describes the technical solutions in the embodiments of the present disclosure with reference to the accompanying drawings in the embodiments of the present disclosure. Apparently, the described embodiments are some but not all of the embodiments of the present disclosure. All other embodiments obtained by a person of ordinary skill in the art based on the embodiments of the present disclosure without creative efforts shall fall within the protection scope of the present disclosure.

Technical solutions in the present disclosure may be applied to various semiconductor lasers such as an edge-emitting laser (Edge-Emitting Laser, "EEL" for short), a vertical-cavity surface-emitting laser VCSEL, and another semiconductor laser.

For ease of description and understanding, the following uses the VCSEL as an example to describe in detail a semiconductor laser and a method for processing the semiconductor laser in the embodiments of the present disclosure. The VCSEL is only an example for description. This is not limited in the present disclosure. The technical solutions in the present disclosure may be further applied to another type of semiconductor laser.

Figure 1:
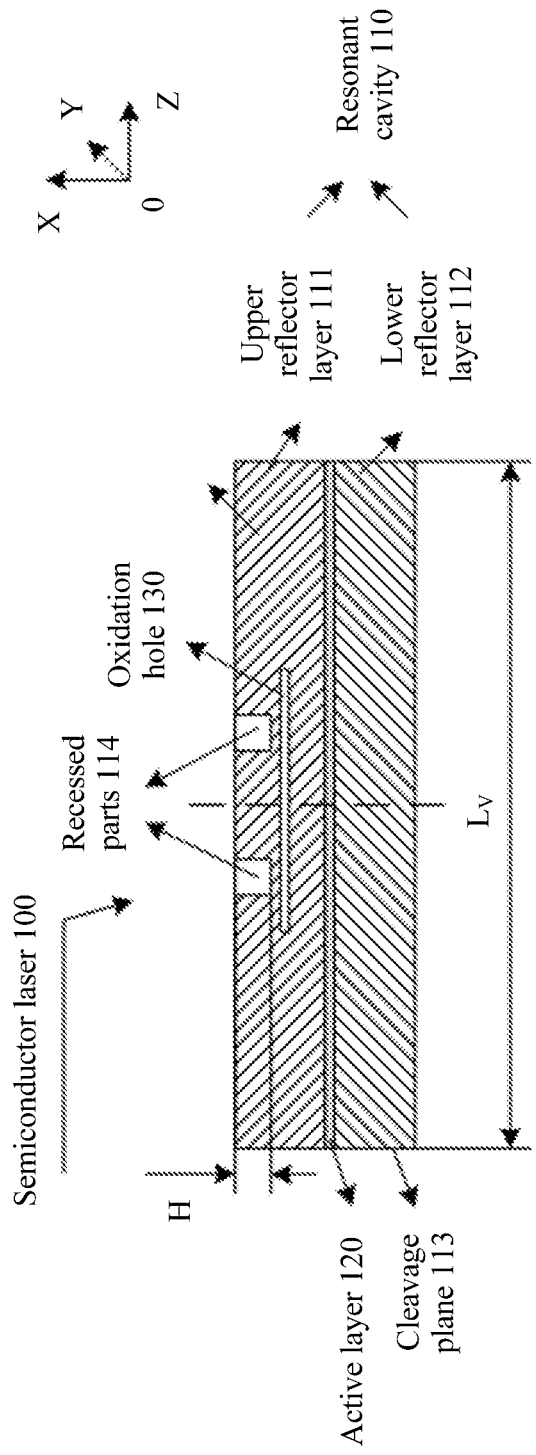
FIG. 1 is a schematic structural diagram of a semiconductor laser according to an embodiment of the present disclosure.
Figure 2A:
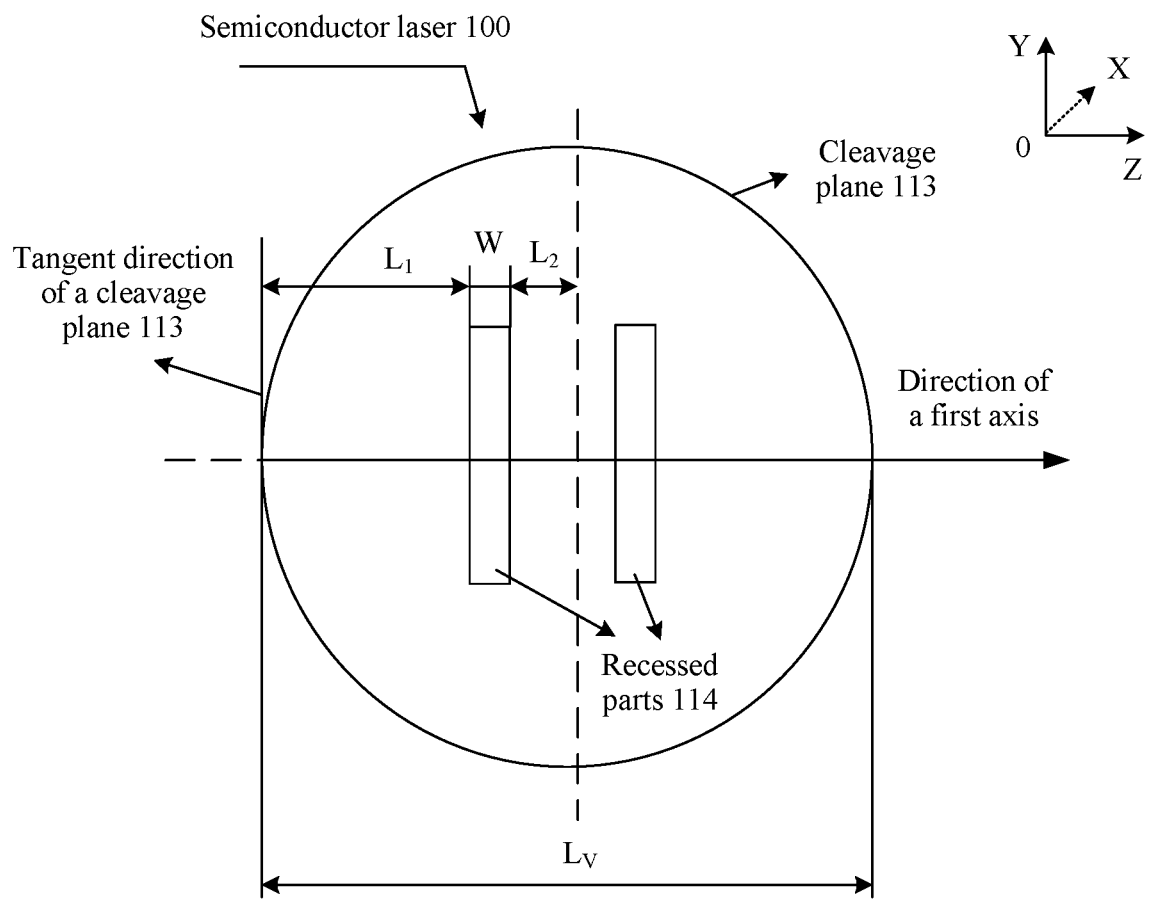
FIG. 2a is another schematic structural diagram of a semiconductor laser according to an embodiment of the present disclosure.

FIG. 1 and FIG. 2 are schematic structural diagrams of a semiconductor laser 100 according to an embodiment of the present disclosure. FIG. 1 is a cutaway drawing of the semiconductor laser 100, and FIG. 2 (including FIG. 2a and FIG. 2b) is a top view of the semiconductor laser 100. FIG. 2a is a top view of a semiconductor laser 100, which is shown as being circular in this example, and FIG. 2b is a top view of a semiconductor laser 100, which is as being square in this example. As shown in FIG. 1 and FIG. 2, the semiconductor laser 100 includes:

a resonant cavity 110, configured to enable a photon entering the resonant cavity 110 to obtain a gain, where the resonant cavity 110 includes an upper reflector layer 111 and a lower reflector layer 112 that are made of a semiconductor material, the upper reflector layer 111 is located above the lower reflector layer 112, a projection of the upper reflector layer 111 on a horizontal plane all falls within a range of a projection of the lower reflector layer 112 on the horizontal plane, a part or all of a side face of the upper reflector layer 111 and a part or all of a side face of the lower reflector layer 112 form a cleavage plane 113 of the semiconductor laser 100, and the cleavage plane 113 is perpendicular to the horizontal plane; and an active layer 120, configured to emit a beam, where the active layer 120 is made of a semiconductor material, the active layer 120 is located between the upper reflector layer 111 and the lower reflector layer 112, a projection of the active layer 120 on the horizontal plane all falls within the range of the projection of the lower reflector layer 112 on the horizontal plane, an oxidation hole 130 is disposed above the active layer 120, and the oxidation hole 130 is configured to limit a transverse mode of the beam.

At least two recessed parts 114 are disposed in at least one of the upper reflector layer 111 or the lower reflector layer 112; projections of the at least two recessed parts 114 on the horizontal plane are located on a first axis; the first axis is perpendicular to a tangent direction of the cleavage plane 113 and the first axis passes through a projection of a center of the active layer 120 on the horizontal plane, or the first axis is perpendicular to the cleavage plane 113; a distance $L_V$ between two points at which the cleavage plane 113 is intersected with the first axis is determined according to a wavelength λ of the beam emitted by the semiconductor laser 100 and a free spectral range FSR; and a shortest distance 1 between each of the at least two recessed parts and the cleavage plane is determined according to the distance $L_V$ and a radius $R_o$ of the oxidation hole 130, so that a first beam that is emitted by the active layer 120 in a direction parallel to the first axis and that is reflected after reaching the cleavage plane 113 and a second beam emitted by the active layer 120 in the direction parallel to the first axis generate photon resonance.

Specifically, in the semiconductor laser 100, the lower reflector layer 112 grows on a substrate in an epitaxial manner, the active layer 120 is adjacent to an upper surface of the lower reflector layer 112, and the oxidation hole 130 is disposed above the active layer 120. For example, the oxidation hole 130 is disposed in the upper reflector layer 111 above the active layer 120, or is disposed in a layer of medium closely adjacent to an upper surface of the active layer 120. The beam emitted by the active layer 120 is emitted in all directions through the oxidation hole 130. The oxidation hole 130 may limit the transverse mode of the beam, and the radius $R_o$ of the oxidation hole determines whether the semiconductor laser is in a multi-transverse mode state or a single-transverse mode state. The projection of the active layer 120 on the horizontal plane all falls within the range of the projection of the lower reflector layer 112 on the horizontal plane, that is, the active layer 120 has a same size and a same shape as the lower reflector layer 112, or has a size smaller than that of the lower reflector layer 112. For example, the lower reflector layer 112 may be square, the active layer 120 is circular, and the two layers have one central axis. Alternatively, both the lower reflector layer 112 and the active layer 120 are square, and have identical sizes and shapes. Similarly, the upper reflector layer 111 is located above the active layer 120, and the projection of the upper reflector layer 111 on the horizontal plane also falls within the range of the projection of the lower reflector layer 112 on the horizontal plane.

It should be noted that, the above-enumerated specific shapes and sizes of all the layers in the semiconductor laser 100 are an example instead of a limitation. A shape of the semiconductor laser 100 is not limited, and may be a shape such as a trapezoid or an ellipse.

It should be further noted that, the above-enumerated size (such as the radius) of the oxidation hole is only an example instead of a limitation. A shape of the oxidation hole in the semiconductor laser is not limited to a circle, and may be a square or another shape. This is not specifically limited in the present disclosure.

Generally, in this embodiment of the present disclosure, all the layers in the semiconductor laser 100 are made of different semiconductor materials. The upper reflector layer 111 and the lower reflector layer 112 are made of a semiconductor material with a relatively high reflectivity (for example, 99.9%). In addition, the upper reflector layer 111 and the lower reflector layer 112 are each formed by means of alternate epitaxial growth by using a semiconductor material with a high refractive index and a semiconductor material with a low refractive index. The upper reflector layer 111 may be made of a P-type semiconductor material that provides an electron hole, and the lower reflector layer 112 may be made of an N-type semiconductor material that provides an electron. Alternatively, the upper reflector layer 111 may be made of an N-type semiconductor material, and the lower reflector layer 112 may be made of a P-type semiconductor material. The upper reflector layer 111 and the lower reflector layer 112 are separately configured to provide an electron and an electron hole (which are collectively referred to as carriers).

The active layer 120 may be made of an extremely thin semiconductor material with a high optical gain, for example, a quantum well (Quantum Well, "QW" for short), so that with stimulation of a current, carriers (such as electrons and electron holes) are recombined to form photons at the active layer 120, and the photons are emitted.

After entering the resonant cavity 110, the photons that are emitted due to stimulation oscillate between the upper reflector layer 111 and the lower reflector layer 112 in the resonant cavity. The resonant cavity 110 most preferentially amplifies, by means of selection, photons that are at a specific frequency and in a same direction, and suppresses a photon that is at another frequency and in another direction. For example, any photon that does not move along an axis of the resonant cavity quickly escapes from the cavity, and is no longer in contact with a working medium. A photon moving along the axis continues to proceed in the cavity, and oscillates due to continuous back-and-forth movement caused by reflection by the upper reflector layer 111 and the lower reflector layer 112. During movement, the photon continuously meets a stimulated particle, so that stimulated radiation is generated. The photon moving along the axis continuously multiplies, and forms intense beams, that is, laser light, with a same propagation direction, a same frequency, and a same phase in the cavity. The beams are emitted by using the upper reflector layer 111.

In the semiconductor laser 100 in this embodiment of the present disclosure, at least two recessed parts are disposed in at least one of the upper reflector layer 111 or the lower reflector layer 112. The at least two recessed parts are located on a same straight line, that is, the first axis. The first axis is perpendicular to the tangent direction of the cleavage plane 113 and the first axis passes through the projection of the center of the active layer 120 on the horizontal plane, or the first axis is perpendicular to the cleavage plane 113. That is, when the semiconductor laser is circular, the first axis is perpendicular to the tangent direction of the cleavage plane and passes through the projection of the center of the active layer 120 on the horizontal plane. When the semiconductor laser is square, the first axis is perpendicular to the cleavage plane. Therefore, the first axis perpendicularly passes through a side wall of each recessed part 114 in the at least two recessed parts. In the present disclosure, the location and the size of the recessed part, and the structure and the size of the semiconductor laser 100 are limited, so that the phase of a beam emitted in the semiconductor laser 100 in a direction of the first axis is controlled. The distance between the two points at which the cleavage plane 113 is intersected with the first axis is denoted as $L_V$ (for ease of description, which is referred to as a semiconductor chip transverse length below). The shortest distance between each recessed part 114 and the cleavage plane is denoted as $L_1$ (for ease of description, which is referred to as a shortest distance $L_1$ below).

By means of simulation and experiment, the semiconductor chip transverse length is determined according to the wavelength λ of the beam emitted by the active layer 120 in the semiconductor laser 100 and the free spectral range (Free Spectral Range, "FSR" for short), and the shortest distance $L_1$ is determined according to the distance $L_V$ and the radius $R_o$ of the oxidation hole. This helps beams generate resonance in the semiconductor laser 100, that is, the first beam (which may be also referred to as a light wave because light is propagated in a form of a wave) that is emitted by the active layer 120 in the semiconductor laser 100 in the direction (for ease of description, which is referred to as a transverse direction below) parallel to the first axis and that is reflected after reaching the cleavage plane 113 and the second beam emitted by the active layer 120 in the transverse direction generate photon resonance. Therefore, modulation bandwidth of the semiconductor laser 100 is increased.

Optionally, the distance $L_V$ meets:

$$L_V = \frac{\lambda^2}{2n_g \cdot FSR},$$

where $n_g$ is a group refractive index of a medium in the cavity of the semiconductor laser.

Specifically, the semiconductor chip transverse length $L_V$ may be determined according to $$L_V = \frac{\lambda^2}{2n_g \cdot FSR}.$$

For the semiconductor laser 100, all of $\lambda$, $n_g$ and the FSR are determined values. After the semiconductor chip transverse length $L_V$ is determined, a phase of a light wave may be controlled, so that photon resonance is implemented.

It should be noted that, semiconductor lasers have different shapes and structures. For example, a surface-emitting laser may be circular or elliptic. For a circular semiconductor laser, the semiconductor chip transverse length $L_V$ may be a diameter of the circular semiconductor laser. For the elliptic semiconductor laser, the semiconductor chip transverse length $L_V$ may be determined according to the location of the recessed part. If the recessed part is on a minor axis of the ellipse, the semiconductor chip transverse length $L_V$ is a length of the minor axis of the ellipse. If the recessed part is on a major axis of the ellipse, the semiconductor chip transverse length $L_V$ is a length of the major axis of the ellipse. For another example, another type of semiconductor laser may be square. The semiconductor chip transverse length $L_V$ of the square semiconductor laser may be a plane distance between two parallel cleavage planes of the square semiconductor laser. It should be understood that, semiconductor lasers with different shapes and structures have different cleavage planes and different semiconductor chip transverse lengths $L_V$. The above-enumerated specific content such as cleavage plane determining and a shape of the semiconductor is not specifically limited in the present disclosure.

It should be further noted that, the recessed part presented on a plane in the cutaway drawing in FIG. 1 is rectangular or square, and the recessed part presented on a plane in the top view in FIG. 2 is rectangular. This is not limited in the present disclosure. The recessed part may be a square groove, a rectangular groove, a cylindrical groove, or the like. A semiconductor material medium whose refractive index is less than $n_{eff}$ may be further filled in the recessed part, where $n_{eff}$ is an effective refractive index that is of the semiconductor laser and that exists when the at least two recessed parts are not disposed. Structures of the above-enumerated recessed part (including a square groove, a rectangular groove, a cylindrical groove, or the like) and the medium filled in the recessed part may be referred to as optical structures.

In this embodiment of the present disclosure, the shortest distance $L_1$ may be a smaller value in perpendicular distances between the cleavage plane 113 and each of two points at which a projection of each recessed part such as the square groove, the rectangular groove, the cylindrical groove, or the like on the horizontal plane is intersected with the first axis.

Optionally, the shortest distance $L_1$ meets:

$$\frac{L_V}{2} - R_o < L_1 < \frac{L_V}{2}.$$

Specifically, the shortest distance $L_1$ may be determined according to $$\frac{L_V}{2} - R_o < L_1 < \frac{L_V}{2},$$

so that a phase of a light wave is controlled, and photon resonance is implemented.

In this embodiment of the present disclosure, by means of simulation and experiment, when the semiconductor chip transverse length $L_V$ is determined according to $$L_V = \frac{\lambda^2}{2n_g \cdot FSR},$$

and the shortest distance $L_1$ is determined according to $$\frac{L_V}{2} - R_o < L_1 < \frac{L_V}{2},$$

it better helps light waves generate photon resonance in the semiconductor laser 100, that is, the first beam that is emitted by the active layer 120 in the semiconductor laser 100 in the transverse direction and that is reflected after reaching the cleavage plane 113 and the second beam emitted by the active layer 120 in the transverse direction generate photon resonance, so that a differential-mode gain $$\frac{dG_{net}}{dN}$$

is increased. The modulation bandwidth is in direction proportion to $$\sqrt{\frac{dG_{net}}{dN}}.$$

Therefore, after optical feedback is introduced to generate photon resonance, modulation bandwidth of a component can be increased.

Further, in this embodiment of the present disclosure, by means of simulation and experiment, after the recessed parts are introduced in a VCSEL, a chirp is decreased. For example, at a rate of 10 Gb/s, the chirp is decreased by 25% after the recessed parts are introduced.

It should be understood that, the VCSEL is only an example instead of a limitation. The recessed part in this embodiment of the present disclosure may also be applied to another semiconductor laser or a continuous multi-wavelength seed light source. This is not specifically limited in the present disclosure.

It should be noted that, for a semiconductor laser with a determined structure and a determined size, a radius $R_o$ of an oxidation hole is a determined value. The radius $R_o$ of the oxidation hole of the semiconductor laser 100 may be obtained by means of measurement or in another manner.

Therefore, according to the semiconductor laser in this embodiment of the present disclosure, at least two recessed parts are disposed in at least one of the upper reflector layer or the lower reflector layer, and a location and a size of each recessed part, and a partial structure and size of the semiconductor laser are limited, so that a traveling wave transmitted in the semiconductor laser in the transverse direction and a reflected wave generate photon resonance. Therefore, modulation bandwidth of a component is increased, and a transmission rate is improved.

Optionally, a distance $L_2$ between a projection of each recessed part 114 on the horizontal plane and the projection of the center of the active layer 120 on the horizontal plane and a distance W between two points at which the same recessed part 114 is intersected with the first axis meet:

$$R_o > W + L_2 > R_s, \text{ where}$$

$R_s$ is a radius of a single-transverse mode spot of the semiconductor laser.

It should be noted that, in this embodiment of the present disclosure, because a recessed part may be a square groove, a rectangular groove, a cylindrical groove, or the like, the distance W (for ease of understanding and description, which is referred to as a recessed part width W below) between the two points at which each of the at least two recessed parts is intersected with the first axis may be a width of the square groove or the rectangular groove in a direction of the first axis, or may be a diameter of the cylindrical groove.

It should be further noted that, in this embodiment of the present disclosure, the distance $L_2$ may be a smaller value in distances between the projection of the center of the active layer on the horizontal plane and each of the two points at which a projection of the square groove, the rectangular groove, the cylindrical groove, or the like on the horizontal plane is intersected with the first axis.

It should be further noted that, in this embodiment of the present disclosure, a relationship among the shortest distance $L_1$, the distance $L_2$ (for ease of description, which is referred to as a distance $L_2$ below) between the projection of the recessed part on the horizontal plane and the projection of the center of the active layer on the horizontal plane, the recessed part width W, and the semiconductor chip transverse length $L_V$ meets $L_1 + L_2 + W = L_V/2$. Therefore, when the semiconductor laser 100 has a symmetrical structure (for example, is cylindrical or square), $W + L_2 < R_o$ is equivalent to $$\frac{L_V}{2} - R_o < L_1 < \frac{L_V}{2}.$$

It should be further noted that, for a semiconductor laser with a determined structure and a determined size, a radius $R_s$ of a single-transverse mode spot is a determined value. The radius $R_s$ of the single-transverse mode spot of the semiconductor laser 100 may be obtained by means of measurement or in another manner.

Specifically, when the semiconductor laser 100 has a symmetrical structure, the semiconductor chip transverse length $L_V$ is determined according to the FSR and the wavelength λ of the beam emitted by the active layer 120 in the semiconductor laser 100. In addition, when the distance $L_2$ and the recessed part width W meet $R_o > W + L_2 > R_s$, a light wave may be further limited, so that a traveling wave transmitted by the active layer 120 in the semiconductor laser 100 in the transverse direction and a reflected wave generate photon resonance. It may be determined from simulation and experiment that, when the semiconductor chip transverse length $L_V$ meets $$L_V = \frac{\lambda^2}{2n_g \cdot FSR},$$

and the recessed part width W and the distance $L_2$ meet $R_o > W + L_2 > R_s$, a traveling wave transmitted by the active layer 120 in the semiconductor laser 100 in the transverse direction and a reflected wave may generate optimal photon resonance which has a maximum amplitude, so that the modulation bandwidth is greatly increased.

Therefore, according to the semiconductor laser in this embodiment of the present disclosure, at least two recessed parts are disposed in at least one of the upper reflector layer or the lower reflector layer, and a location and a size of each recessed part, and a partial structure and size of the semiconductor laser are strictly limited, so that a traveling wave transmitted in the semiconductor laser in the transverse direction and a reflected wave generate photon resonance. Therefore, modulation bandwidth of a component is increased, and a chirp is decreased.

Due to a structural feature of the VCSEL in this embodiment of the present disclosure, a longitudinal size and a transverse size of the VCSEL are greatly different. The longitudinal size of the component is relatively small, and a longitudinal-mode interval is relatively large, so that working in a single-longitudinal mode state is easy to implement. The transverse size of the component is relatively large, and mode limitation is relatively weak. There are a plurality of transverse modes. Different transverse modes are distributed differently, and are overlapped with each other, and all the transverse modes contend with each other intensely. This greatly affects output optical power of the semiconductor laser.

Single-mode output optical power is lower than multi-mode output optical power, but a single-mode transmission loss is small and long-distance transmission is easy to implement. Therefore, a main factor that the VCSEL performs long-distance high-speed fiber optic communication is that the VCSEL can meet high output optical power, high modulation bandwidth, and single-mode output.

In this embodiment of the present disclosure, the radius $R_o$ of the oxidation hole 130 is controlled, so that the semiconductor laser 100 is in the multi-transverse mode state. After the at least two recessed parts 114 are disposed in at least one of the upper reflector layer 111 or the lower reflector layer 112, and the location (for example, the shortest distance $L_1$ or the distance $L_2$) and the size (for example, the recessed part width W and a recessed part depth H) of the recessed part are controlled, mode limitation is introduced, so that a high order mode of the multi-transverse mode semiconductor laser is limited, and a fundamental transverse mode can still work normally. Therefore, the semiconductor laser is switched from the multi-transverse mode to the single-transverse mode. However, because there is still multi-transverse mode output optical power, even if the semiconductor laser is switched from the multi-transverse mode to the single-transverse mode by means of mode limitation after the foregoing sizes are limited, the output optical power is far higher than pure single-transverse mode output optical power.

Optionally, the radius $R_o$ of the oxidation hole is greater than A, so that the semiconductor laser is in the multi-transverse mode state. A is a preset constraint factor that determines whether the semiconductor laser is in the single-transverse mode state or the multi-transverse mode state. The depth H of the recessed part 114 is determined according to the wavelength λ, so that the semiconductor laser is switched from the multi-transverse mode state to the single-transverse mode state.

As an example instead of a limitation, in the VCSEL in this embodiment of the present disclosure, when the radius $R_O$ of the oxidation hole is greater than 2.5 μm, the semiconductor laser is a multi-transverse mode VCSEL. When the radius $R_O$ of the oxidation hole is less than 2.5 μm, the semiconductor laser is a single-transverse mode VCSEL.

In this embodiment of the present disclosure, when the semiconductor chip transverse length $L_V$, the recessed part width W, and the shortest distance $L_1$ or the distance $L_2$ are determined, the depth H of the recessed part may be further determined according to the wavelength λ of the beam emitted by the active layer 120 in the semiconductor laser 100, so that the VCSEL is switched from the multi-transverse mode state to the single-transverse mode state.

The depth H of the recessed part directly affects light-emitting efficiency of the semiconductor laser. For example, when the depth H of the recessed part is relatively small, a loss of the high order mode is relatively small, and the single-transverse mode cannot be implemented. When the depth H of the recessed part is relatively large, both the high order mode and the fundamental transverse mode have losses, and relatively high output optical power during single-mode working cannot be obtained. When the recessed part is close to the active layer, light-emitting efficiency of the active layer 120 is affected. Therefore, the depth H of the recessed part needs to be strictly controlled, so that a traveling wave transmitted by the active layer 120 in the semiconductor laser 100 in the transverse direction and a reflected wave generate photon resonance, and the output optical power of the semiconductor laser is improved while the modulation bandwidth is increased.

It should be noted that, the above-enumerated factor (that is, the depth H of the recessed part) that affects the output optical power is only an example for description. This is not limited in the present disclosure. A factor such as the location of the recessed part also affects the output optical power of the semiconductor laser.

Optionally, the depth H meets:

$$H = \frac{(2m+1)\lambda}{4n_{eff}},$$

where m≥0, m is an integer, and $n_{eff}$ is an effective refractive index that is of the semiconductor laser and that exists when the at least two recessed parts are not disposed.

Specifically, in this embodiment of the present disclosure, when the semiconductor chip transverse length $L_V$, the recessed part width W, and the shortest distance $L_1$ or the distance $L_2$ are limited, the depth H of the recessed part is further controlled, so that the depth H meets $$H = \frac{(2m+1)\lambda}{4n_{eff}}.$$

Therefore, the high order mode can be most effectively limited, and the semiconductor laser works in the single-transverse mode state.

In this embodiment of the present disclosure, it may be determined from simulation and experiment that, when the semiconductor chip transverse length $L_V$ meets $$L_V = \frac{\lambda^2}{2n_g \cdot FSR},$$

the distance $L_2$ and the recessed part width W meet $R_O > W + L_2 > R_S$, and the depth H of the recessed part 114 meets $$H = \frac{(2m+1)\lambda}{4n_{eff}},$$

light waves emitted by the active layer 120 in the semiconductor laser 100 in the transverse direction may generate optimal photon resonance which has a maximum amplitude, and highest output optical power is obtained.

Therefore, in this embodiment of the present disclosure, the radius $R_o$ of the oxidation hole, the shortest distance $L_1$ or the distance $L_2$, and the recessed part depth H may be controlled. The output optical power of the semiconductor laser is improved by means of cooperation between all the sizes. A change in any one of the sizes affects the output optical power which consequently cannot reach an optimal value.

Optionally, the distance $L_2$ between the projection of each recessed part on the horizontal plane to the projection of the center of the active layer on the horizontal plane meets:

$$L_2 = \frac{V_{eff} \cdot \lambda}{2\pi \cdot \sqrt{n_{eff}^2 - (n_{eff} - \gamma \cdot \Delta n)^2}} \text{ and } B < V_{eff} < C,$$

where

B and C are preset constraint factors determining that the semiconductor laser is in a single-longitudinal mode state, $V_{eff}$ is a normalized frequency parameter, γ is an impact factor of the depth H of the recessed part, and $n_{eff}$ is the effective refractive index that is of the semiconductor laser and that exists when the at least two recessed parts are not disposed.

In the present disclosure, the structure of the multi-mode VCSEL, and the location and the size of the recessed part are limited, so that the semiconductor chip transverse length $L_V$ meets $$L_V = \frac{\lambda^2}{2n_g \cdot FSR},$$

the distance $L_2$ and the recessed part width W meet $R_O > W + L_2 > R_S$, and the recessed part depth H meets $$H = \frac{(2m+1)\lambda}{4n_{eff}}.$$

Therefore, the multi-mode VCSEL can implement single-mode working, obtain improved output optical power, and obtain increased modulation bandwidth.

In addition, further, because the recessed parts are introduced, the single-longitudinal mode state of the VCSEL may be unstable. Therefore, the normalized frequency parameter is controlled, so that $0.6 < V_{eff} < 2.405$. Because the shortest distance $L_1$ or the distance $L_2$ is closely related to the normalized frequency parameter $V_{\mathit{eff}}$, that is, $$V_{\mathit{eff}} = \frac{2\pi \cdot L_2}{\lambda} \sqrt{n_{\mathit{eff}}^2 - (n_{\mathit{eff}} - \gamma \cdot \Delta n)^2},$$

$L_1$ or $L_2$ needs to be controlled, so that $V_{\mathit{eff}}$ meet $0.6 < V_{\mathit{eff}} < 2.405$. Therefore, the multi-mode VCSEL may stably work in the single-longitudinal mode state or the single-transverse mode state, and thermal fluctuation may be reduced, to implement reliable working, and obtain relatively high output optical power.

It should be understood that, the above-enumerated specific values of the preset constraint factor A that determines whether the semiconductor laser is in the single-transverse mode state or the multi-transverse mode state, and the preset constraint factors B and C determining that the semiconductor laser is in the single-longitudinal mode state is only an example instead of a limitation. For different types of semiconductor lasers, the values may be different. This is not specifically limited in the present disclosure.

Optionally, two recessed parts 114 that are symmetrical with reference to the center of the active layer 120 are disposed in the upper reflector layer 111 or the lower reflector layer 112 of the semiconductor laser 100.

In this embodiment of the present disclosure, it may be set that a quantity of recessed parts is an even number. As an example instead of a limitation, two recessed parts 114 that are symmetrical with reference to the center of the active layer 120 may be disposed in the semiconductor laser 100. For another example, a plurality of recessed parts 114 may be disposed in the semiconductor laser 100. Locations and sizes of the plurality of recessed parts 114 are limited, so that the first beam that is emitted by the active layer 120 in the semiconductor laser 100 in the transverse direction and that is reflected after reaching the cleavage plane 113 and the second beam emitted by the active layer 120 in the transverse direction generate photon resonance.

It should be noted that, the above-enumerated specific content such as the recessed part location and quantity is only an example for description, and shall not constitute any limitation to the present disclosure.

Optionally, the upper reflector layer 111 is a distributed Bragg reflector, the lower reflector layer 112 is a distributed Bragg reflector, and the semiconductor laser is a vertical-cavity surface-emitting laser.

It should be understood that, the distributed Bragg reflectors (Distributed Bragg Reflector, "DBR" for short) used as the upper reflector layer 111 and the lower reflector layer 112 are only an example instead of a limitation. The upper reflector layer 111 and the lower reflector layer 112 may be made of another semiconductor material such as a thin film material or a grating with a high refractive index difference. Alternatively, either the upper reflector layer 111 or the lower reflector layer 112 in the VCSEL is a DBR. This is not specifically limited in the present disclosure.

Therefore, according to the semiconductor laser in this embodiment of the present disclosure, recessed parts are introduced, and the structure and the size of the semiconductor laser, and a location and a size of the recessed part are limited, so that optical feedback and mode limitation are introduced in the semiconductor laser, and in addition, a switchover from a multi-mode state to a single-mode state is implemented, the output optical power is improved, the modulation bandwidth is increased, and the chirp is decreased. Therefore, a requirement for high-speed long-distance transmission is met to a greater extent.

The semiconductor laser in the embodiment of the present disclosure is described above in detail with reference to FIG. 1 and FIG. 2. A method 200 for processing a semiconductor laser in an embodiment of the present disclosure is described below in detail with reference to FIG. 3.

FIG. 3 shows a method 200 for processing a semiconductor laser according to an embodiment of the present disclosure. As shown in FIG. 3, the method 200 includes the following steps:

S210. Form a resonant cavity, where the resonant cavity is configured to enable a photon entering the resonant cavity to obtain a gain, the resonant cavity includes an upper reflector layer and a lower reflector layer that are made of a semiconductor material, the upper reflector layer is located above the lower reflector layer in a vertical direction, a projection of the upper reflector layer on a horizontal plane all falls within a range of a projection of the lower reflector layer on the horizontal plane, a part or all of a side face of the upper reflector layer and a part or all of a side face of the lower reflector layer form a cleavage plane of the semiconductor laser, and the cleavage plane is perpendicular to the horizontal plane.

S220. Form an active layer, where the active layer is configured to emit a beam, the active layer is made of a semiconductor material, the active layer is located between the upper reflector layer and the lower reflector layer, a projection of the active layer on the horizontal plane all falls within the range of the projection of the lower reflector layer on the horizontal plane, an oxidation hole is disposed above the active layer, and the oxidation hole is configured to limit a transverse mode of the beam.

S230. Process at least two recessed parts in at least one of the upper reflector layer or the lower reflector layer, where projections of the at least two recessed parts on the horizontal plane are located on a first axis; the first axis is perpendicular to a tangent direction of the cleavage plane and the first axis passes through a projection of a center of the active layer on the horizontal plane, or the first axis is perpendicular to the cleavage plane; a distance $L_V$ between two points at which the cleavage plane is intersected with the first axis is determined according to a wavelength λ of the beam and a free spectral range FSR; and a shortest distance $L_1$ between each of the at least two recessed parts and the cleavage plane is determined according to the distance $L_V$ and a radius $R_o$ of the oxidation hole, so that a first beam that is emitted by the active layer in a direction parallel to the first axis and that is reflected after reaching the cleavage plane and a second beam emitted by the active layer in the direction parallel to the first axis generate photon resonance.

Optionally, the distance L meets:

$$L_V = \frac{\lambda^2}{2n_g \cdot FSR},$$

where $n_g$ is a group refractive index of a medium in the cavity of the semiconductor laser.

Optionally, the shortest distance $L_1$ meets:

$$\frac{L_V}{2} - R_o < L_1 < \frac{L_V}{2}.$$

Optionally, a distance $L_2$ between a projection of each recessed part on the horizontal plane and the projection of the center of the active layer on the horizontal plane and a distance W between two points at which the same recessed part is intersected with the first axis meet:

$$R_o > W + L_2 > R_s, \text{ where}$$

$R_s$ is a radius of a single-transverse mode spot of the semiconductor laser.

Optionally, the radius $R_o$ of the oxidation hole is greater than A, so that the semiconductor laser is in a multi-transverse mode state, and A is a preset constraint factor that determines whether the semiconductor laser is in a single-transverse mode state or the multi-transverse mode state.

The processing at least two recessed parts in at least one of the upper reflector layer or the lower reflector layer includes:

determining a depth H of the recessed part according to the wavelength $\lambda$; and processing the at least two recessed parts in at least one of the upper reflector layer or the lower reflector layer according to the depth H, so that the semiconductor laser is switched from the multi-transverse mode state to the single-transverse mode state.

Optionally, the determining a depth H of the recessed part according to the wavelength $\lambda$ includes:

determining the depth H of the recessed part according to $$H = \frac{(2m+1)\lambda}{4n_{eff}},$$

where m≥0, m is an integer, and $n_{eff}$ is an effective refractive index that is of the semiconductor laser and that exists when the at least two recessed parts are not disposed.

Optionally, the radius $R_o$ of the oxidation hole is greater than A, and the distance $L_2$ between the projection of each recessed part on the horizontal plane and the projection of the center of the active layer on the horizontal plane meets:

$$L_2 = \frac{V_{eff} \cdot \lambda}{2\pi \cdot \sqrt{n_{eff}^2 - (n_{eff} - \gamma \cdot \Delta n)^2}} \text{ and } B < V_{eff} < C,$$

where

B and C are preset constraint factors determining that the semiconductor laser is in a single-longitudinal mode state, and $n_{eff}$ is the effective refractive index that is of the semiconductor laser and that exists when the at least two recessed parts are not disposed.

Optionally, two recessed parts that are symmetrical with reference to the center of the active layer are disposed in the upper reflector layer or the lower reflector layer of the semiconductor laser.

Optionally, the upper reflector layer is a distributed Bragg reflector, the lower reflector layer is a distributed Bragg reflector, and the semiconductor laser is a vertical-cavity surface-emitting laser.

Therefore, in the method for processing a semiconductor laser in this embodiment of the present disclosure, recessed parts are introduced, and a structure and a size of the semiconductor laser, and a location and a size of the recessed part are limited, so that optical feedback and mode limitation are introduced in the semiconductor laser, and in addition, a switchover from a multi-mode state to a single-mode state is implemented, output optical power is improved, modulation bandwidth is increased, and a chirp is decreased. Therefore, a requirement for high-speed long-distance transmission is met to a greater extent.

It should be understood that sequence numbers of the foregoing processes do not mean execution sequences in various embodiments of the present disclosure. The execution sequences of the processes should be determined according to functions and internal logic of the processes, and should not be construed as any limitation to the implementation processes of the embodiments of the present disclosure.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present disclosure.

It may be clearly understood by a person skilled in the art that, for the purpose of convenient and brief description, for a detailed working process of the foregoing system, apparatus, and unit, refer to a corresponding process in the foregoing method embodiment, and details are not described herein again.

In the several embodiments provided in this application, it should be understood that the disclosed system, apparatus, and method may be implemented in other manners. For example, the described apparatus embodiment is only an example. For example, the unit division is only logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments.

In addition, functional units in the embodiments of the present disclosure may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present disclosure essentially, or the part contributing to the prior art, or some of the technical solutions may be implemented in a form of a software product. The software product is stored in a storage medium, and includes several instructions for instructing a computer device (which may be a personal computer, a server, a network device, or the like) to perform all or some of the steps of the methods described in the embodiments of the present disclosure. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are only specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A semiconductor laser, comprising:
   a resonant cavity, configured to enable a photon entering the resonant cavity to obtain a gain, wherein the resonant cavity comprises an upper reflector layer and a lower reflector layer that are made of a semiconductor material, the upper reflector layer being located above the lower reflector layer, a projection of the upper reflector layer on a horizontal plane falling within a range of a projection of the lower reflector layer on the horizontal plane;
   a side wall comprising a part or all of a side face of the upper reflector layer and a part or all of a side face of the lower reflector layer, wherein the side wall is perpendicular to the horizontal plane; and
   an active layer, configured to emit a beam, wherein the active layer is made of a semiconductor material, the active layer is located between the upper reflector layer and the lower reflector layer, and a projection of the active layer on the horizontal plane falls within the range of the projection of the lower reflector layer on the horizontal plane, wherein an oxidation hole is disposed above the active layer, and the oxidation hole is configured to limit a transverse mode of the beam; and wherein
   at least two recessed parts are disposed in at least one of the upper reflector layer or the lower reflector layer;
   projections of the at least two recessed parts on the horizontal plane are located on a first axis, wherein the first axis is perpendicular to a tangent direction of the side wall and the first axis passes through a projection of a center of the active layer on the horizontal plane, or the first axis is perpendicular to the side wall;
   a value of a distance $L_V$ between two points at which the side wall is intersected with the first axis is a function of a wavelength λ of the beam and a free spectral range (FSR); and
   a value of a shortest distance $L_1$ between each of the at least two recessed parts and the side wall is a function of the distance $L_V$ and a radius $R_o$ of the oxidation hole, and a first beam emitted by the active layer in a direction parallel to the first axis, the first beam being reflected after reaching the side wall, and a second beam emitted by the active layer in the direction parallel to the first axis generate photon resonance; and, wherein the distance $L_2$ between the projection of each recessed part on the horizontal plane and the projection of the center of the active layer on the horizontal plane meets:

$$L_2 = \frac{V_{\textit{eff}} \cdot \lambda}{2\pi \cdot \sqrt{n_{\textit{eff}}^2 - (n_{\textit{eff}} - \gamma \cdot \Delta n)^2}} \text{ and } B < V_{\textit{eff}} < C,$$

wherein
   B and C are preset constraint factors determining that the semiconductor laser is in a single-longitudinal mode state, $V_{\textit{eff}}$ is a normalized frequency parameter, γ is an impact factor of the depth H of the recessed part, and $n_{\textit{eff}}$ is the effective refractive index that is of the semiconductor laser and that exists when the at least two recessed parts are not disposed.

2. The semiconductor laser according to claim 1, wherein the distance $L_V$ meets:

$$L_V = \frac{\lambda^2}{2n_g \cdot FSR},$$

wherein
   $n_g$ is a group refractive index of a medium in the cavity of the semiconductor laser.

3. The semiconductor laser according to claim 1, wherein the shortest distance $L_1$ meets:

$$\frac{L_V}{2} - R_o < L_1 < \frac{L_V}{2}.$$

4. The semiconductor laser according to claim 1, wherein a distance $L_2$ between a projection of each recessed part on the horizontal plane and the projection of the center of the active layer on the horizontal plane and a distance W between two points at which the same recessed part is intersected with the first axis meet:

$R_o > W + L_2 > R_s$, wherein $R_s$ is a radius of a single-transverse mode spot of the semiconductor laser.

5. The semiconductor laser according to claim 1, wherein the radius $R_o$ of the oxidation hole is greater than A, and the semiconductor laser is in a multi-transverse mode state, wherein A is a preset constraint factor that determines whether the semiconductor laser is in a single-transverse mode state or the multi-transverse mode state; and
   a value of a depth H of each recessed part is a function of the wavelength λ, and the semiconductor laser is switched from the multi-transverse mode state to the single-transverse mode state.

6. The semiconductor laser according to claim 5, wherein the depth H meets:

$$H = \frac{(2m+1)\lambda}{4n_{\textit{eff}}},$$

wherein
   m≥0, m is an integer, and $n_{\textit{eff}}$ is an effective refractive index that is of the semiconductor laser and that exists when the at least two recessed parts are not disposed.

7. The semiconductor laser according to claim 1, wherein the upper reflector layer is a distributed Bragg reflector, the lower reflector layer is a distributed Bragg reflector, and the semiconductor laser is a vertical-cavity surface-emitting laser.

* * * * *